United States Patent
Higashiuchi et al.

(10) Patent No.: US 9,525,114 B2
(45) Date of Patent: Dec. 20, 2016

(54) OPTICAL SEMICONDUCTOR DEVICE

(71) Applicant: HITACHI CHEMICAL COMPANY, LTD., Tokyo (JP)

(72) Inventors: Tomoko Higashiuchi, Tsukuba (JP); Nobuaki Takane, Tsukuba (JP); Masashi Yamaura, Tsukuba (JP); Maki Inada, Tsukuba (JP); Hiroshi Yokota, Chikusei (JP)

(73) Assignee: HITACHI CHEMICAL COMPANY, LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/405,946

(22) PCT Filed: Jun. 6, 2013

(86) PCT No.: PCT/JP2013/065688
§ 371 (c)(1),
(2) Date: Dec. 5, 2014

(87) PCT Pub. No.: WO2013/183706
PCT Pub. Date: Dec. 12, 2013

(65) Prior Publication Data
US 2015/0171293 A1    Jun. 18, 2015

(30) Foreign Application Priority Data
Jun. 6, 2012    (JP) ................. 2012-129028

(51) Int. Cl.
*H01L 33/00*    (2010.01)
*H01L 33/60*    (2010.01)
(Continued)

(52) U.S. Cl.
CPC ............. *H01L 33/60* (2013.01); *H01L 33/486* (2013.01); *H01L 33/56* (2013.01); *H01L 33/62* (2013.01);
(Continued)

(58) Field of Classification Search
CPC ....................................................... H01L 33/60
(Continued)

(56) References Cited

U.S. PATENT DOCUMENTS 7,157,745 B2    1/2007  Blonder et al.
9,112,122 B2 *  8/2015  Hatano .............. C09K 11/7774
(Continued)

FOREIGN PATENT DOCUMENTS

CN    104053818 A    9/2014
JP    2008-010591    1/2008
(Continued)

OTHER PUBLICATIONS

Notification of Transmittal of Translation of the IPRP on Patentability in PCT/JP2013/065688.
(Continued)

*Primary Examiner* — Tan N Tran
(74) *Attorney, Agent, or Firm* — Fitch, Even, Tabin & Flannery LLP

(57) ABSTRACT

An optical semiconductor device includes a substrate that has a silver plating layer formed on a surface, a light emitting diode that is bonded to the silver plating layer, a light reflecting portion that surrounds the light emitting diode, a transparent sealing portion that is filled into the light reflecting portion and seals the light emitting diode, and a clay film that covers the silver plating layer. The transparent sealing portion and the light reflecting portion are bonded to each other.

6 Claims, 11 Drawing Sheets

(51) Int. Cl.
  *H01L 33/62* (2010.01)
  *H01L 33/48* (2010.01)
  *H01L 33/56* (2010.01)
  H01L 33/44 (2010.01)
  H01L 33/54 (2010.01)

(52) U.S. Cl.
  CPC ............... *H01L 33/44* (2013.01); *H01L 33/54* (2013.01); *H01L 2224/48091* (2013.01); *H01L 2224/48465* (2013.01); *H01L 2224/73265* (2013.01); *H01L 2224/8592* (2013.01)

(58) Field of Classification Search
  USPC .............................................. 257/98, 99, 100
  See application file for complete search history.

(56) References Cited

U.S. PATENT DOCUMENTS

2005/0224830 A1* 10/2005 Blonder et al. ............... 257/100
2007/0027248 A1  2/2007 Ebina et al.
2009/0010017 A1  1/2009 Hayashi et al.
2012/0134137 A1* 5/2012 Lee ............................... 362/97.1

FOREIGN PATENT DOCUMENTS

| | | |
|---|---|---|
| JP | 2008-041706 | 2/2008 |
| JP | 2009-170825 A | 7/2009 |
| JP | 2009-224538 | 10/2009 |
| JP | 2010-239043 | 10/2010 |
| JP | 2011-009143 | 1/2011 |
| WO | WO2005/023714 | 3/2005 |
| WO | WO2007/015426 | 2/2007 |
| WO | WO2010/074038 | 7/2010 |

OTHER PUBLICATIONS

Office Action mailed Jun. 20, 2016, for Chinese Application No. 201380029857.X.

* cited by examiner (a)

(b)

(a)

(b)

(a)

(b)

(a)

(b)

OPTICAL SEMICONDUCTOR DEVICE

TECHNICAL FIELD

The present invention relates to an optical semiconductor device to which a light emitting diode is bonded.

BACKGROUND ART

As an optical semiconductor device on which a light emitting diode (LED) is mounted, an optical semiconductor device disclosed in PTL 1 has been known. In the optical semiconductor device described in PTL 1, a blue LED is bonded to a molding, the molding is raised to surround the blue LED, the molding is used as a reflection plate to reflect light emitted from the blue LED, a transparent sealing portion containing a fluorescent material is filled into the molding, and the blue LED is sealed.

CITATION LIST

Patent Literature

PTL 1: PCT2007/015426

SUMMARY OF INVENTION

Technical Problem

Recently, the optical semiconductor device has been adopted as illumination or LED illumination such as a street lamp. However, if the optical semiconductor device is actually used, illuminance of the LED illumination may decrease earlier than a guarantee time of the LED. This is because a silver plating layer is formed in an electrode of the optical semiconductor device and a color of the silver plating layer changes. That is, because a resin having high permeability of gas or moisture is generally used in the transparent sealing portion, the silver plating layer is corroded by the gas or the moisture having transmitted the transparent sealing portion and a color thereof changes. Particularly, if the silver plating layer is sulfurated by hydrogen sulfide gas, a color of the electrode changes to a black color. For this reason, the illuminance is notably decreased.

In the past, a thermoplastic resin is adopted as the reflection plate and a xanthosis speed of the reflection plate is faster than a sulfuration speed of the silver plating layer. For this reason, the illuminance decrease by the sulfuration of the silver plating layer is not outstanding. However, recently, a thermosetting resin is adopted as the reflection plate and the xanthosis speed of the reflection plate is slower than the sulfuration speed of the silver plating layer. For this reason, the illuminance decrease by the sulfuration of the silver plating layer is outstanding. In addition, if the LED illumination has high power, a heat generation temperature of the blue LED increases and a temperature of the silver plating layer increases. For this reason, the sulfuration of the silver plating layer may be accelerated.

Furthermore, there is a movement to standardize an evaluation of hydrogen sulfide gas resistance of the optical semiconductor device adopted for the LED illumination in view of the problem caused by the sulfuration of the silver plating layer.

Therefore, the inventors have obtained knowledge that the sulfuration of the silver plating layer can be effectively suppressed by covering the silver plating layer with a clay film, without improving the gas permeability of the transparent sealing portion, after performing an examination zealously.

Further, the inventors have found a problem that there is room for optimization of a configuration of the optical semiconductor device, from the viewpoint of suppressing removal of the transparent sealing portion for the optical semiconductor device, to sandwich the clay film between the silver plating layer and the transparent sealing portion, after producing the optical semiconductor device on the basis of the knowledge.

Accordingly, an object of the present invention is to provide an optical semiconductor device that can suppress a transparent sealing portion from being removed while suppressing a silver plating layer from being sulfurated.

According to one aspect of the present invention, there is provided an optical semiconductor device including: a substrate that has a silver plating layer formed on a surface; a light emitting diode that is bonded to the silver plating layer, a light reflecting portion that surrounds the light emitting diode; a transparent sealing portion that is filled into the light reflecting portion and seals the light emitting diode; and a clay film that covers the silver plating layer, wherein the transparent sealing portion and the light reflecting portion are bonded to each other.

Solution to Problem

According to the optical semiconductor device according to one aspect of the present invention, because the silver plating layer is covered with the clay film, sulfuration of the silver plating layer can be suppressed. Thereby, an illuminance decrease of the optical semiconductor device due to a change of a color of the silver plating layer to a black color can be further suppressed. The silver plating layer is covered with the clay film, so that the clay film is sandwiched between the transparent sealing portion and the silver plating layer. However, because the transparent sealing portion and the light reflecting portion are bonded to each other, the transparent sealing portion can be suppressed from being removed.

In addition, in one aspect of the present invention, the light reflecting portion may include an inner circumferential surface that rises from the substrate to surround the light emitting diode and forms an internal space storing the light emitting diode, the clay film may cover a part of the inner circumferential surface, and the transparent sealing portion may be bonded to a non-covering portion of the inner circumferential surface not covered with the clay film.

The covering of the clay film for the silver plating layer can be performed by diluting the clay with a solvent to generate a clay diluted solution, dropping or spraying the clay diluted solution on the internal space of the light reflecting portion, and drying the solvent. However, because the internal space of the light reflecting portion is small, it is difficult to drop or spray the clay diluted solution on only the silver plating layer by adjusting a drop amount or a spray amount of the clay diluted solution. Therefore, the covering of the clay film for the silver plating layer can be easily performed by allowing the clay film to cover the inner circumferential surface of the light reflecting portion. Even in this case, because the transparent sealing portion and the non-covering portion of the inner circumferential surface of the light reflecting portion are bonded to each other, the transparent sealing portion can be suppressed from being removed.

In addition, in one aspect of the present invention, the light emitting diode may be a blue light emitting diode that generates blue light.

The inner circumferential surface of the light reflecting portion reflects light generated from the light emitting diode and outputs the light from the optical semiconductor device. However, because the clay film has a function of amplifying a frequency band of the blue light, the clay film is formed on the inner circumferential surface of the light reflecting portion, so that reflection efficiency of the blue light generated from the blue light emitting diode can be increased.

In addition, in one aspect of the present invention, an area of the non-covering portion may be equal to or more than 1% of an area of the inner circumferential surface. As such, the area of the non-covering portion is set to be equal to or more than 1% of the inner circumferential surface of the light reflecting portion, so that bonding strength of a light transmitting resin portion and the light reflecting portion can be secured.

In addition, in one aspect of the present invention, an area of the non-covering portion may be equal to or less than 99% of an area of the inner circumferential surface. As such, the area of the non-covering portion is set to be equal to or less than 99% of the inner circumferential surface of the light reflecting portion, so that the covering of the clay film for the silver plating layer can be easily performed.

In addition, in one aspect of the present invention, the light reflecting portion may include an inner circumferential surface that rises from the substrate to surround the light emitting diode and forms an internal space storing the light emitting diode and a top surface that is adjacent to the inner circumferential surface and is positioned outside the internal space, the clay film may cover the inner circumferential surface, and the transparent sealing portion may be bonded to the top surface.

The covering of the clay film for the silver plating layer can be performed by diluting the clay with the solvent to generate the clay diluted solution, dropping or spraying the clay diluted solution on the internal space of the light reflecting portion, and drying the solvent. However, because the internal space of the light reflecting portion is small, it is difficult to drop or spray the clay diluted solution on only the silver plating layer by adjusting the drop amount or the spray amount of the clay diluted solution. Therefore, the covering of the clay film for the silver plating layer car be easily performed by allowing the clay film to cover the entire surface of the inner circumferential surface of the light reflecting portion. Even in this case, because the transparent sealing portion and the top surface of the light reflecting portion are bonded to each other, the transparent sealing portion can be suppressed from being removed. The transparent sealing portion and the top surface of the light reflecting portion can be bonded by dropping or spraying the clay diluted solution on the internal space of the light reflecting portion such that the clay diluted solution overflows from the internal space of the light reflecting portion and drying the solvent.

Advantageous Effects of Invention

According to the present invention, an optical semiconductor device that can suppress a transparent sealing portion from being removed while suppressing a silver plating layer from being sulfurated can be provided.

DESCRIPTION OF EMBODIMENTS

Figure 1:
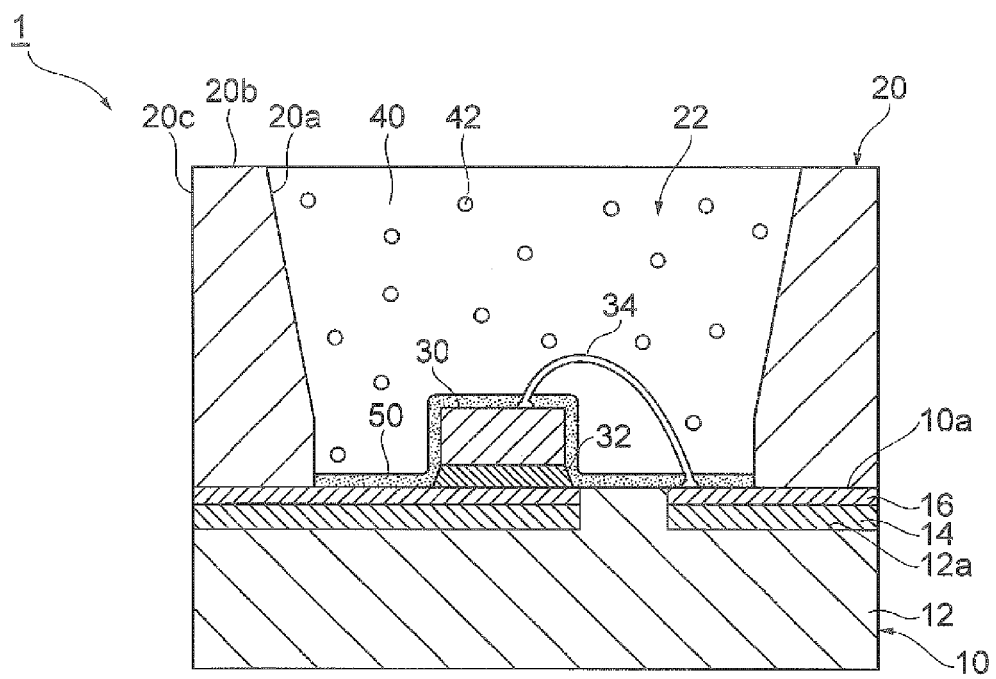
FIG. 1 is a cross-sectional view of an optical semiconductor device according to an embodiment.

Hereinafter, preferred embodiments of an optical semiconductor device according to one aspect of the present invention will be described in detail with reference to the drawings. In all drawings, the same or corresponding portions are denoted with the same reference numerals.

Figure 2:
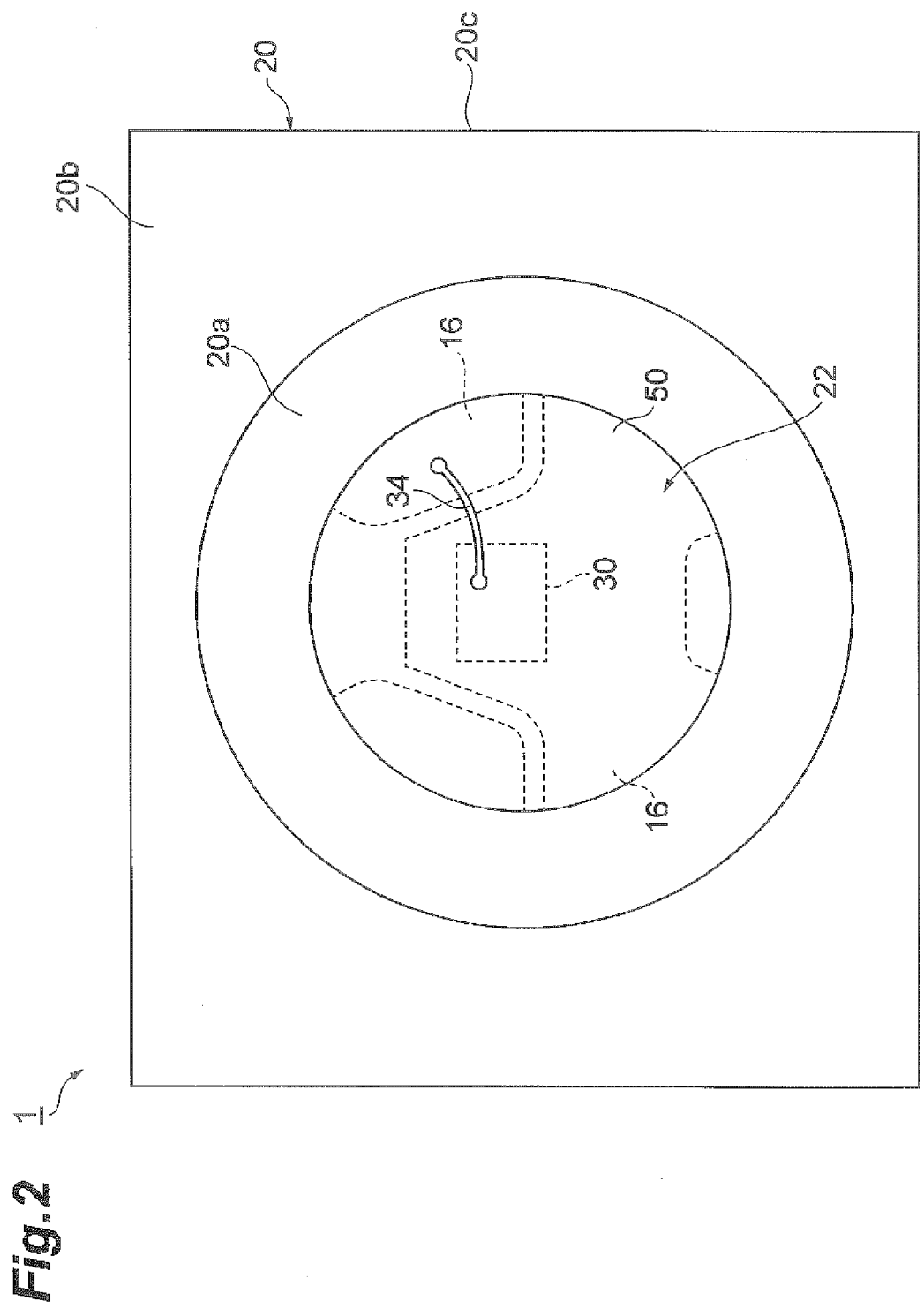
FIG. 2 is a plan view of the optical semiconductor device illustrated in FIG. 1.

FIG. 1 is a cross-sectional view of an optical semiconductor device according to an embodiment. FIG. 2 is a plan view of the optical semiconductor device illustrated in FIG. 1. As illustrated in FIGS. 1 and 2, an optical semiconductor device 1 according to the embodiment is generally classified into a "surface mounting type". The optical semiconductor device 1 includes a substrate 10, a blue LED 30 that is bonded to a surface of the substrate 10, a reflector 20 that is provided on the surface of the substrate 10 to surround the blue LED 30, and a transparent sealing resin 40 that is filled into the reflector 20 and seals the blue LED 30. In FIG. 2, illustration of the transparent sealing resin 40 is omitted.

In the substrate 10, a copper plating plate 14 is arranged on a surface of an insulating base 12 and a silver plating layer 16 is formed on a surface of the copper plating plate 14. The silver plating layer 16 is arranged on the surface of the substrate 10 and becomes an electrode electrically connected to the blue LED 30. The silver plating layer 16 may have any composition as long as a layer is a plating layer containing silver. For example, the silver plating layer 16 may be formed by plating only the silver or the silver plating layer 16 may be formed by plating nickel and the silver in order. The copper plating plate 14 and the silver plating layer 16 are insulated from each other at an anode side and a cathode side. Insulation between the copper plating plate 14 and the silver plating layer 16 of the anode side and the copper plating plate 14 and the silver plating layer 16 of the cathode side can be performed by separating the copper plating plate 14 and the silver plating layer 16 of the anode side and the copper plating plate 14 and the silver plating layer 16 of the cathode side and appropriately inserting an insulating layer such as a resin or ceramic therebetween.

The blue LED 30 is die-bonded to the silver plating layer 16 of one side of the anode side and the cathode side and is electrically connected to the silver plating layer 16 through a die bond material 32. In addition, the blue LED 30 is wire-bonded to the silver plating layer 16 of the other side of the anode side and the cathode side and is electrically connected to the silver plating layer 16 through bonding wire 34.

The reflector 20 fills a transparent sealing resin 40 to seal the blue LED 30 and reflects light emitted from the blue LED 30 on the surface side of the optical semiconductor device 1. The reflector 20 is erected from the surface of the substrate 10 to surround the blue LED 30. That is, the reflector 20 rises from a surface 10*a* of the substrate 10 to surround the blue LED 30 to form an internal space 22 storing the blue LED 30 inside. The reflector 20 includes an inner circumferential surface 20*a* that is formed in a circular shape in the plan view (refer to FIG. 2), a top surface 20*b* that is adjacent to the inner circumferential surface 20*a*, is positioned outside the internal space 22, and extends from a surface side end edge of the inner circumferential surface 20*a* to the side opposite to the internal space 22, and an outer circumferential surface 20*c* that rises from the surface 10*a* of the substrate 10 to an outside end edge of the top surface 20*b* and is formed in a rectangular shape in the plan view (refer to FIG. 2). The shapes of the inner circumferential surface 20*a* and the outer circumferential surface 20*c* are not limited in particular. However, the inner circumferential surface 20*a* is preferably formed in a truncated cone shape (funnel shape) of which a diameter increases as a distance with the substrate 10 increases, from the viewpoint of improvement of illuminance of the optical semiconductor device 1, and the outer circumferential surface 20*c* is preferably formed in a square shape vertical to the substrate 10, from the viewpoint of improvement of integration of the optical semiconductor device 1. In the drawings, as a formation example of the inner circumferential surface 20*a*, an inner circumferential surface in which a lower portion positioned at the side of the substrate 10 is vertical to the substrate 10 and an upper portion positioned at the side opposite to the substrate 10 has a diameter increasing as a distance with the substrate 10 increases is illustrated.

The reflector 20 is made of a hardened material of a thermosetting resin composition containing a white pigment. The thermosetting resin composition is preferably a thermosetting resin composition in which pressurization molding is enabled at a room temperature (25° C.) before thermal hardening, from the viewpoint of formation easiness of the reflector 20.

As a thermosetting resin contained in the thermosetting resin composition, various resins such as an epoxy resin, a silicon resin, a urethane resin, and a cyanate resin can be used. Particularly, the epoxy resin is preferable because the epoxy resin has superior adhesiveness for various materials.

As the white pigment, alumina, magnesium oxide, antimony oxide, titanium oxide, or zirconium oxide can be used. Among them, the titanium oxide is preferable from the viewpoint of a light reflecting property. An inorganic hollow particle may be used as the white pigment. As a specific example of the inorganic hollow particle, there are silicate soda glass, alumisilicate glass, borosilicate soda glass, and shirasu.

The transparent sealing resin 40 is filled into the internal space 22 formed by the inner circumferential surface 20*a* of the reflector 20 and seals the blue LED 30. The transparent sealing resin 40 is made of a transparent sealing resin having a light transmitting property. In the transparent sealing resin, a semitransparent resin is included in addition to a perfectly transparent resin. As the transparent sealing resin, a resin in which elastic modulus is 1 MPa or less at a room temperature (25° C.) is preferable. Particularly, a silicon resin or an acrylic resin is preferably adopted, from the viewpoint of transparency. The transparent sealing resin may further contain an inorganic filling material diffusing light or a fluorescent material 42 generating white light using the blue light emitted from the blue LED 30 as excitation light.

In addition, in the optical semiconductor device 1 according to this embodiment, the silver plating layer 16 is covered with the clay film 50 and the transparent sealing resin 40 and the reflector 20 are bonded to each other.

Figure 11:
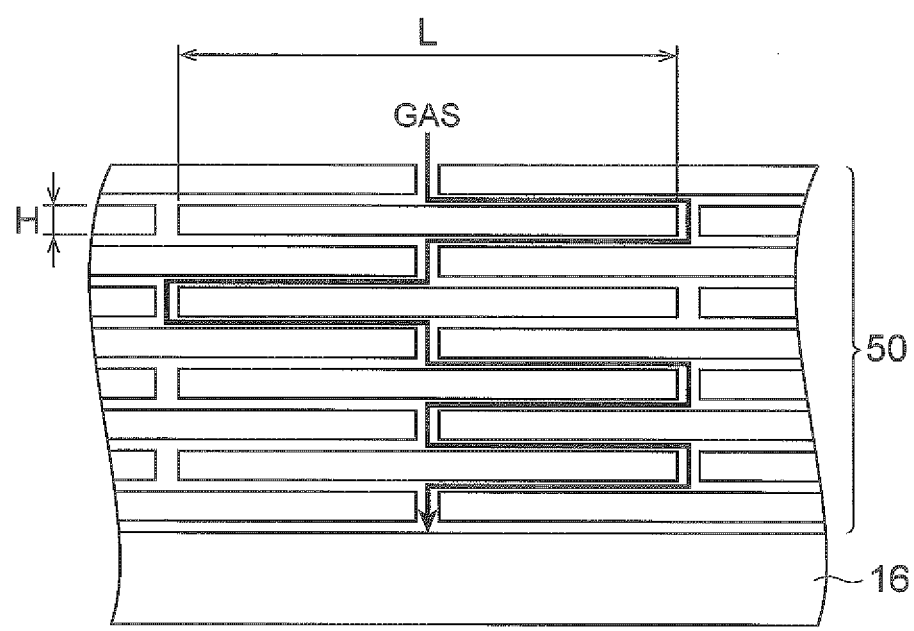
FIG. 11 is a conceptual diagram illustrating a configuration of a clay film using montmorillonite.

The clay film 50 covers the silver plating layer 16 to suppress sulfuration of the silver plating layer 16. As clay configuring the clay film 50, both natural clay and synthetic clay can be used. For example, at least one of stevensite, hectorite, saponite, montmorillonite, and beidellite can be used. Particularly, in the montmorillonite of the natural clay, as illustrated in FIG. 11, a thickness H is equal to or less than 1 nm, a length L is 10 nm to 400 nm, an aspect ratio is high, and a path route of gas is lengthened. Therefore, the montmorillonite of the natural clay has a superior gas barrier property.

A thickness of the clay film 50 is preferably 0.01 µm to 1000 µm, is further preferably 0.03 µm to 500 µm, is further preferably 0.05 µm to 100 µm, is further preferably 0.05 µm to 10 µm, and is further preferably 0.05 µm to 1 µm. The thickness of the clay film 50 is set to 0.01 µm to 1000 µm, so that both the gas barrier property for the silver plating layer 16 and the transparency of the clay film 50 can be realized. In this case, the thickness of the clay film 50 is set to 0.03 µm to 500 µm, 0.05 µm to 100 µm, 0.05 µm to 10 µm, and 0.05 µm to 1 µm, so that the effect can be further improved.

Here, a method of covering the clay film 50 will be described with reference to FIGS. 3 to 6 and a method of filling the transparent sealing resin 40 will be described with reference to FIGS. 7 to 10. FIGS. 3 to 6 are diagrams illustrating the method of covering the clay film. FIGS. 7 to 10 are cross-sectional views of an optical semiconductor device into which the transparent sealing resin is filled.

First, a clay diluted solution obtained by diluting the clay with a solvent is generated. Next, as illustrated in (a) of FIG. 3, a clay diluted solution L is dropped or sprayed on the internal space 22 of the reflector 20. At this time, a drop amount or a spray amount of the clay diluted solution L is adjusted such that at least the entire layer of the silver plating layer 16 is covered with the clay diluted solution L. Then, the solvent of the clay diluted solution L is dried. In this case, as illustrated in (b) of FIG. 3, the clay film 50 in which the dried clay is stacked is formed over an entire range covered with the clay diluted solution L.

As such, because the clay film 50 is formed over the entire range in which the clay diluted solution L is dropped or sprayed, it is necessary to drop or spray the clay diluted solution L on only the silver plating layer 16 to cover only the silver plating layer 16 with the clay film 50. However, because the internal space 22 is minute, it is difficult to drop or spray the clay diluted solution L on only the silver plating layer 16 by adjusting the drop amount or the spray amount of the clay diluted solution L.

Meanwhile, because the clay film 50 formed at the thickness of 0.01 µm to 1000 µm using the clay has a sufficient light transmitting property, formation of the clay film 50 on the inner circumferential surface 20*a* of the reflector 20 does not affect a reflection characteristic of the reflector 20. In addition, because a thin film of the montmorillonite which is the natural clay has a function of amplifying a frequency band of blue light, the clay film 50 using the montmorillonite which is the natural clay is formed in the reflector 20, so that reflection efficiency of the blue light emitted from the blue LED 30 can be increased.

Figure 4:
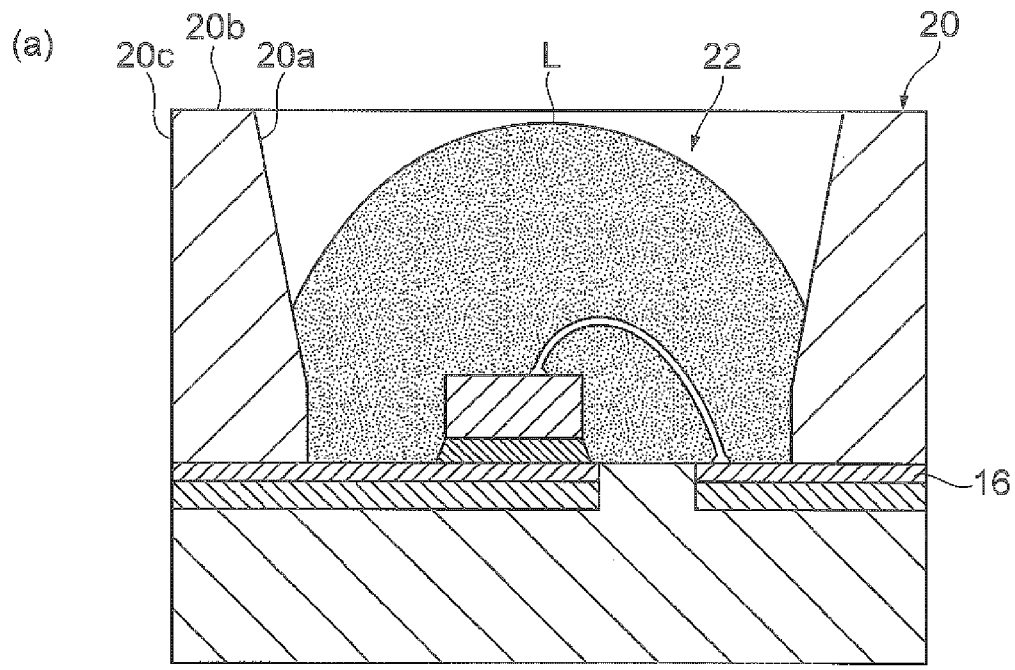
FIG. 4 is a diagram illustrating a method of covering a clay film.
Figure 4:
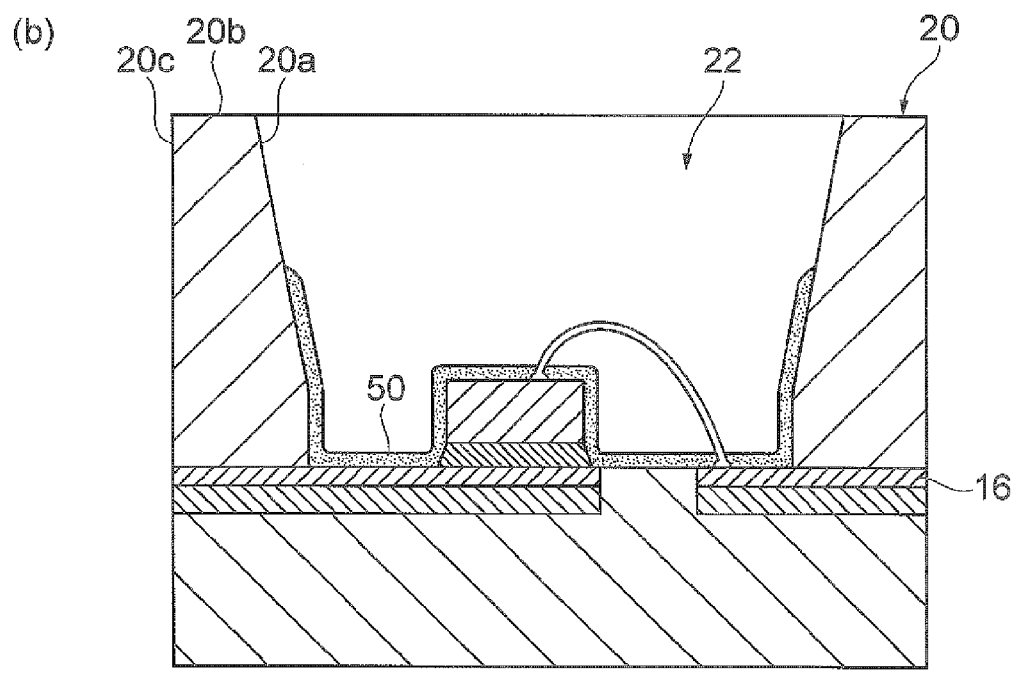

Therefore, as illustrated in (a) of FIG. 4, the clay diluted solution L is dropped or sprayed on the internal space 22, such that a part of the inner circumferential surface 20a of the reflector 20 is covered with the clay diluted solution. In addition, as illustrated in (b) of FIG. 4, the solvent of the clay diluted solution L is dried, so that the clay film 50 is formed on the part of the inner circumferential surface 20a of the reflector 20.

Figure 5:
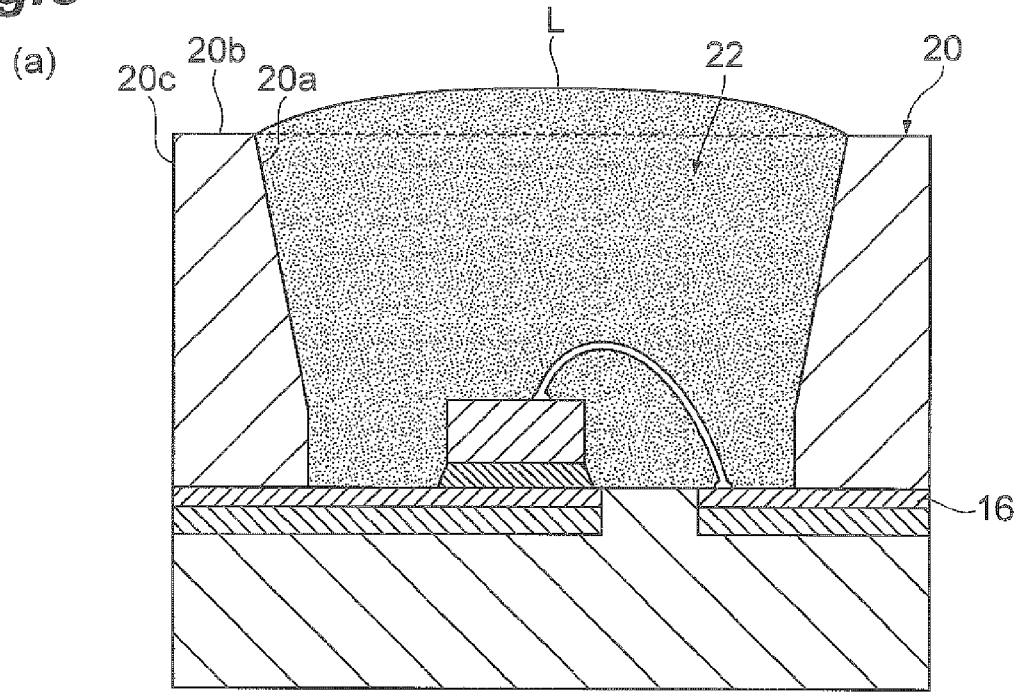
FIG. 5 is a diagram illustrating a method of covering a clay film.
Figure 5:
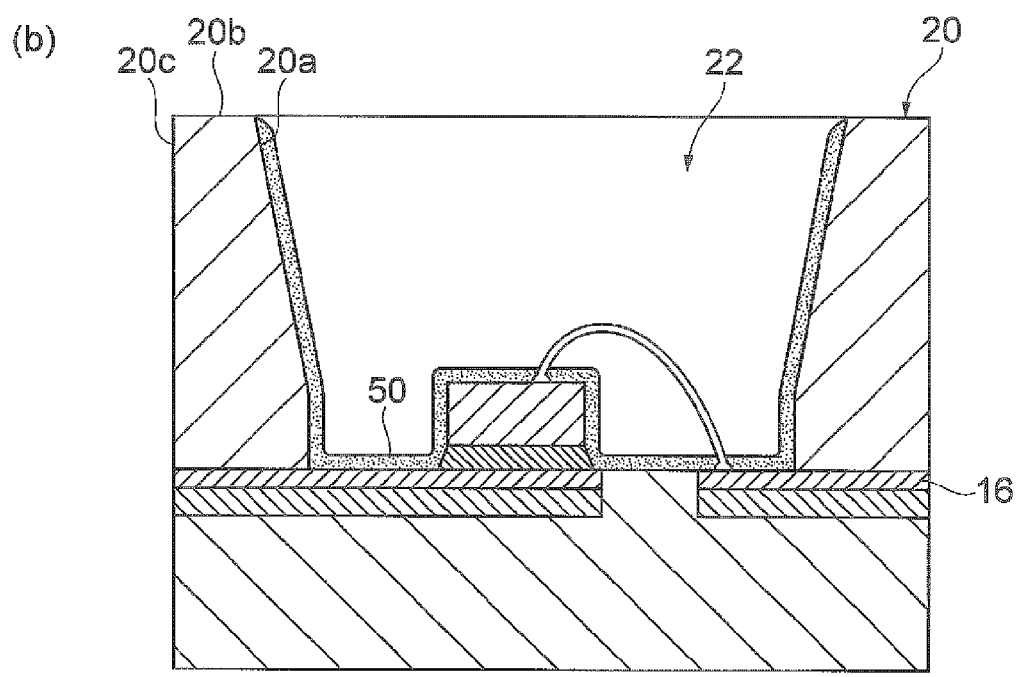

In addition, as illustrated in (a) of FIG. 5, the clay diluted solution L may be dropped or sprayed on the internal space 22, such that an entire surface of the inner circumferential surface 20a of the reflector 20 is covered with the clay diluted solution. In this case, as illustrated in (b) of FIG. 5, if the solvent of the clay diluted solution L is dried, the clay film 50 is formed on the entire surface of the inner circumferential surface 20a of the reflector 20.

Figure 6:
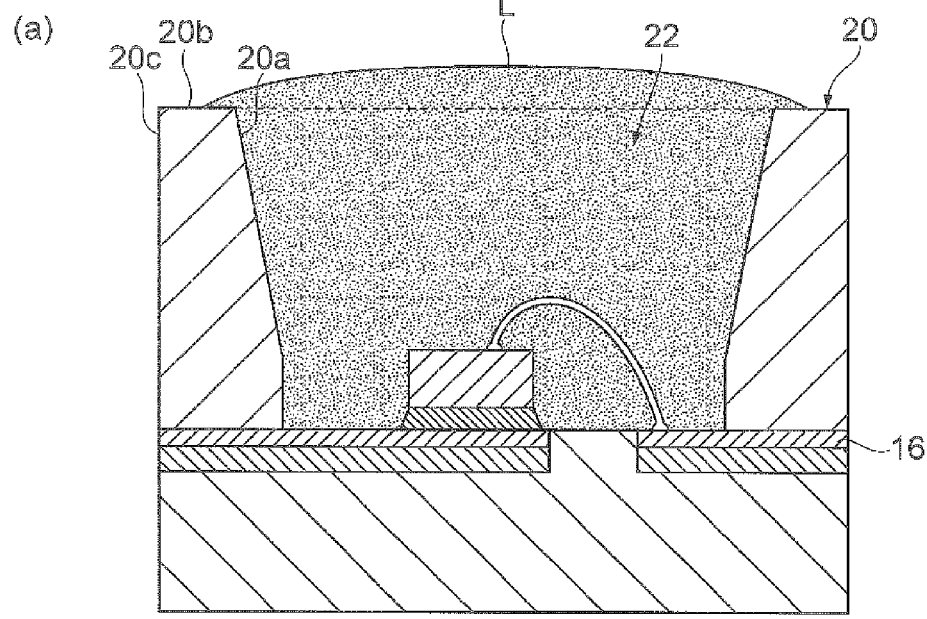
FIG. 6 is a diagram illustrating a method of covering a clay film.
Figure 6:
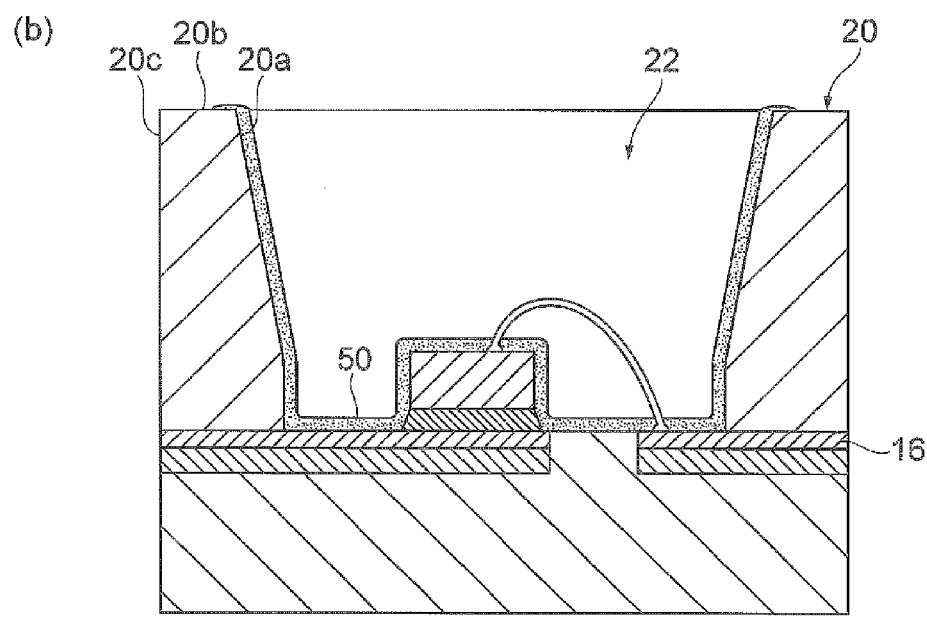

In addition, as illustrated in (a) of FIG. 6, the clay diluted solution L may be dropped or sprayed on the internal space 22, such that a portion to the top surface 20b beyond the inner circumferential surface 20a of the reflector 20 is covered with the clay diluted solution. In this case, as illustrated in (b) of FIG. 6, if the solvent of the clay diluted solution L is dried, the clay film 50 is formed to the top surface 20b of the reflector 20.

In addition, if the clay film 50 is formed, the transparent sealing resin 40 containing the fluorescent material 42 is filled into the internal space 22 formed by the inner circumferential surface 20a of the reflector 20 and the blue LED 30 is sealed by the filled transparent sealing resin 40.

Figure 3:
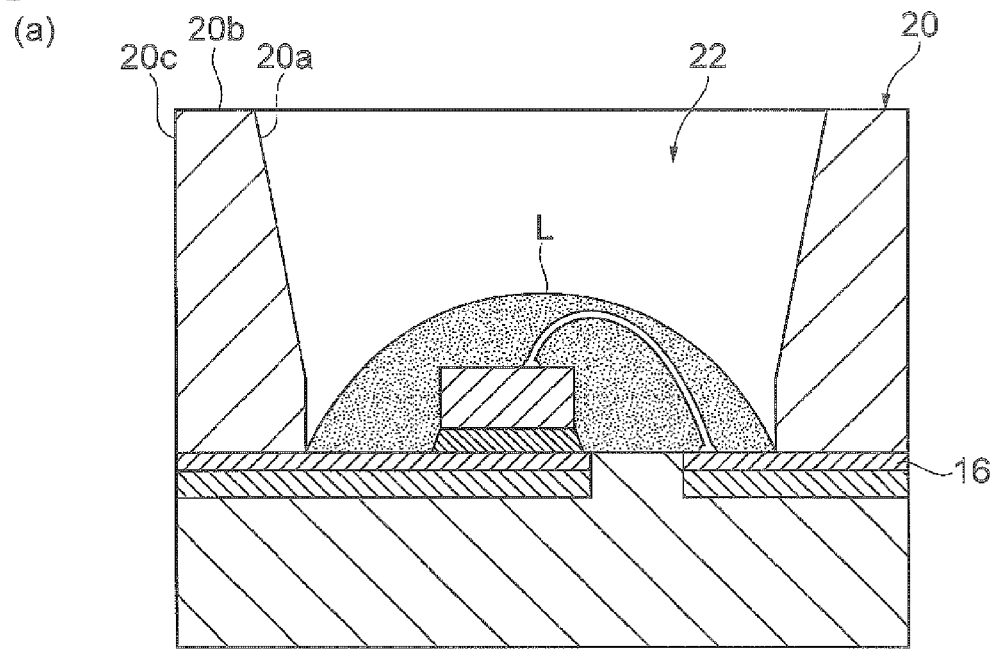
FIG. 3 is a diagram illustrating a method of covering a clay film.
Figure 3:
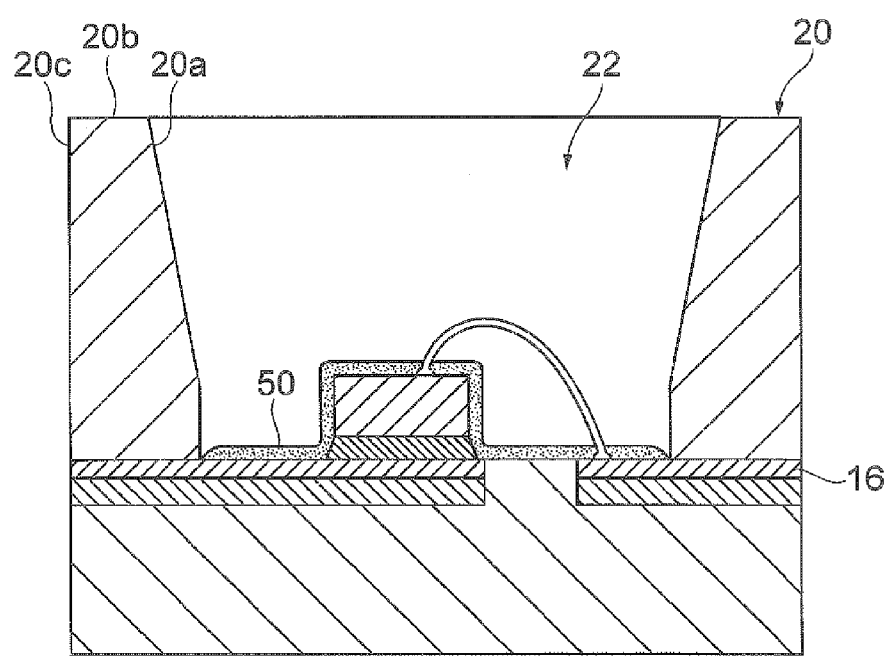
Figure 7:
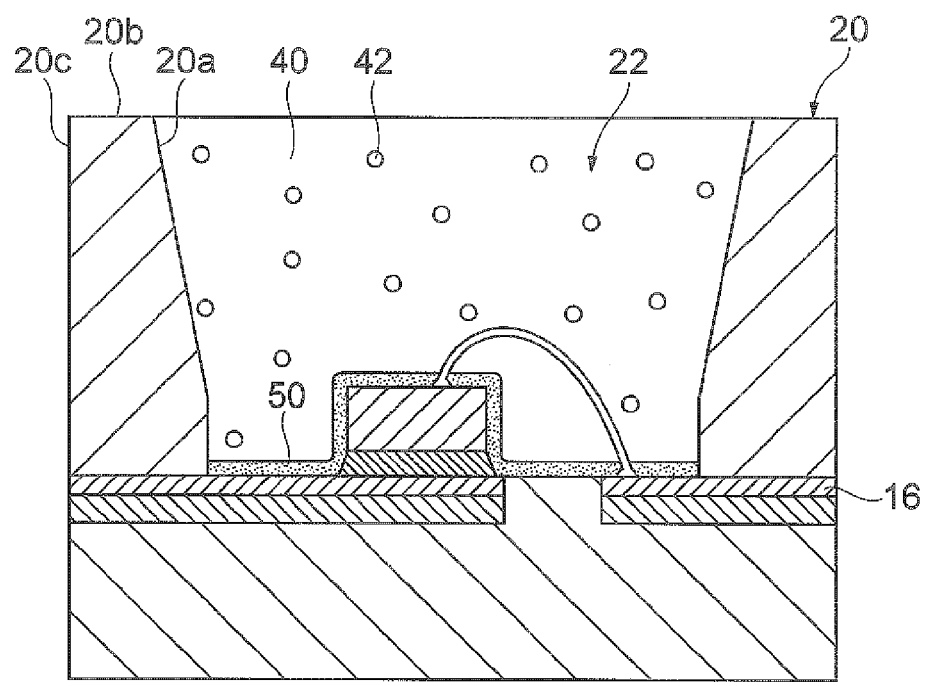
FIG. 7 is a cross-sectional view of an optical semiconductor device into which a transparent sealing resin is filled, in the case of FIG. 3.

At this time, as illustrated in (b) of FIG. 3, when the clay film 50 is not formed on the inner circumferential surface 20a of the reflector 20, as illustrated in FIG. 7, the transparent sealing resin 40 containing the fluorescent material 42 is filled into the internal space 22 and the filled transparent sealing resin 40 is closely adhered to the entire surface of the inner circumferential surface 20a of the reflector 20. Thereby, the optical semiconductor device 1 in which the entire surface of the inner circumferential surface 20a of the reflector 20 and the transparent sealing resin 40 are bonded to each other is obtained.

Figure 8:
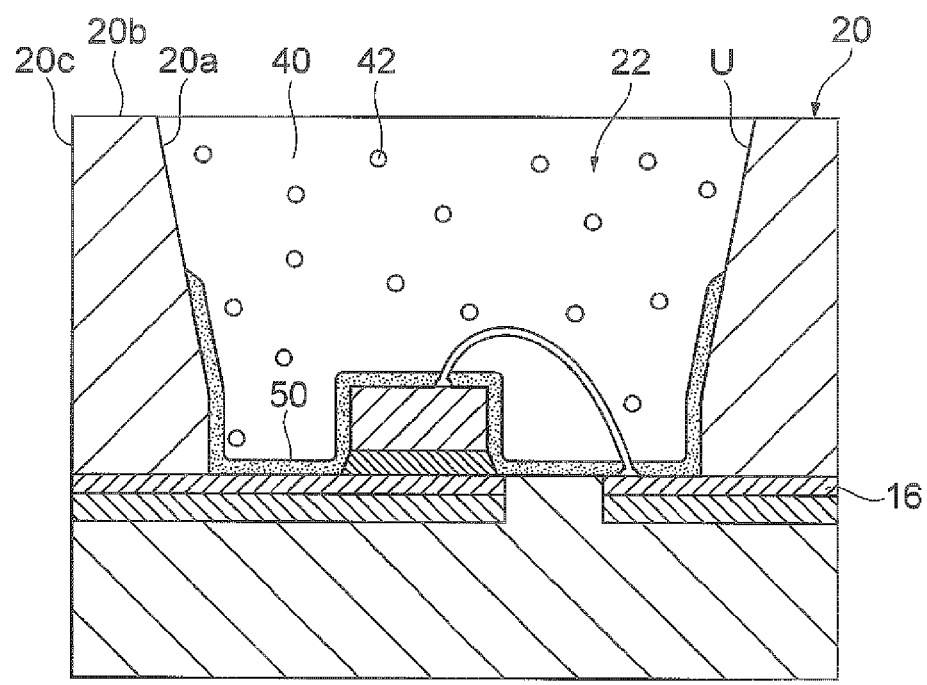
FIG. 8 is a cross-sectional view of an optical semiconductor device into which a transparent sealing resin is filled, in the case of FIG. 4.

In addition, as illustrated in (b) of FIG. 4, when the clay film 50 is formed on the part of the inner circumferential surface 20a of the reflector 20, as illustrated in FIG. 8, the transparent sealing resin 40 containing the fluorescent material 42 is filled into the internal space 22 and the filled transparent sealing resin 40 is closely adhered to a non-covering portion U not covered with the clay film 50 in the inner circumferential surface 20a of the reflector 20. Thereby, the optical semiconductor device 1 in which the non-covering portion U which is the part of the inner circumferential surface 20a of the reflector 20 and the transparent sealing resin 40 are bonded to each other is obtained.

At this time, an area of the non-covering portion U is preferably equal to or more than 1% of an area of the inner circumferential surface 20a, is more preferably equal to or more than 5%, and is further preferably equal to or more than 10%. The area of the non-covering portion U is set to be equal to or more than 1% of the area of the inner circumferential surface 20a, so that bonding strength of the inner circumferential surface 20a of the reflector 20 and the transparent sealing resin 40 can be secured. In addition, the ratio of the non-covering portion U is set to be equal to or more than 5% or equal to or more than 10%, so that the effect can be further improved.

Meanwhile, the area of the non-covering portion U is preferably equal to or less than 99% of the area of the inner circumferential surface 20a, is more preferably equal to or less than 95%, and is further preferably equal to or less than 90%. The area of the non-covering portion U is set to be equal to or less than 99% of the area of the inner circumferential surface 20a, so that covering of the clay film 50 can be easily performed. In addition, the ratio of the non-covering portion U is set to be equal to or less than 95% or equal to or less than 90%, so that the effect can be further improved.

Figure 9:
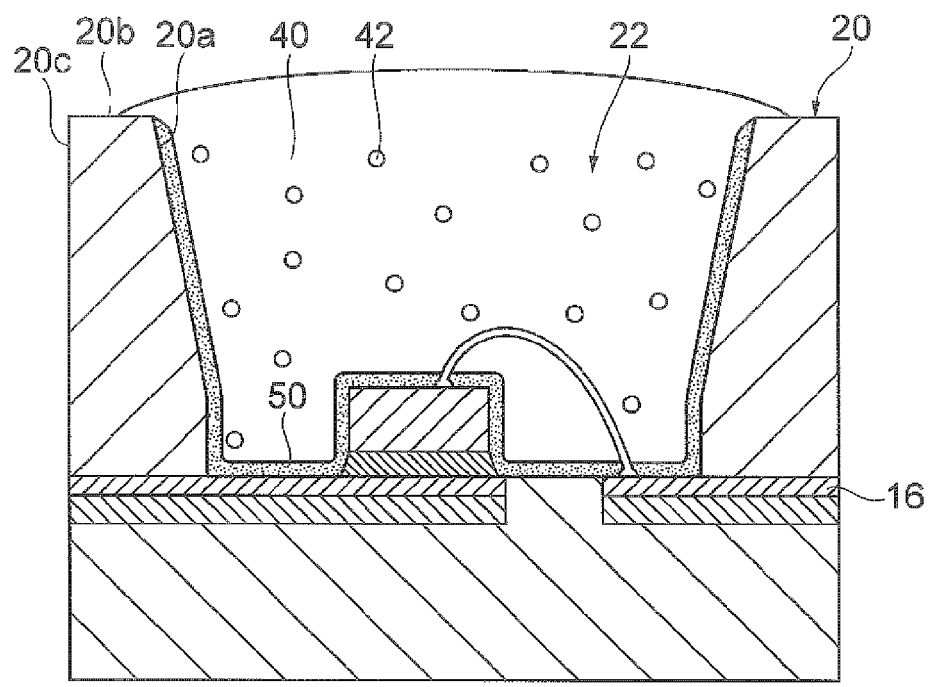
FIG. 9 is a cross-sectional view of an optical semiconductor device into which a transparent sealing resin is filled, in the case of FIG. 5.

In addition, as illustrated in (b) of FIG. 5, when the clay film 50 is formed on the entire surface of the inner circumferential surface 20a of the reflector 20, as illustrated in FIG. 9, the transparent sealing resin 40 containing the fluorescent material 42 is filled into the internal space 22 until the transparent sealing resin 40 overflows from the internal space 22 and reaches the top surface 20b and the filled transparent sealing resin 40 is closely adhered to the top surface 20b of the reflector 20. Thereby, the optical semiconductor device 1 in which the top surface 20b of the reflector 20 and the transparent sealing resin 40 are bonded to each other is obtained.

Figure 10:
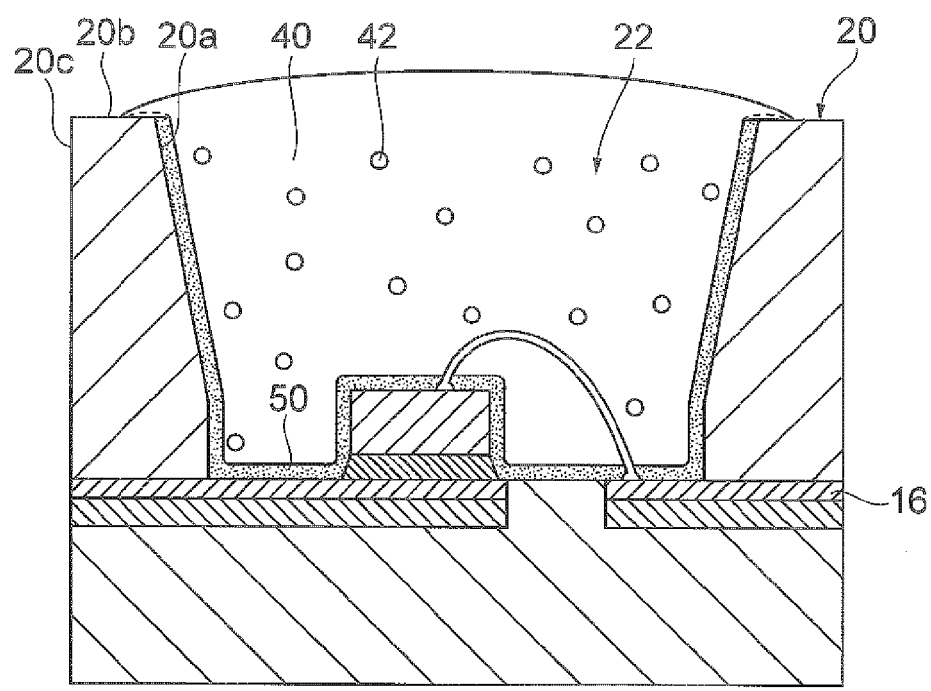
FIG. 10 is a cross-sectional view of an optical semiconductor device into which a transparent sealing resin is filled, in the case of FIG. 6.

In addition, as illustrated in (b) of FIG. 6, when the clay film 50 is formed to the top surface 20b of the reflector 20, as illustrated in FIG. 10, first, the clay film 50 formed on the top surface 20b is removed. Then, the transparent sealing resin 40 containing the fluorescent material 42 is filled into the internal space 22 until the transparent sealing resin 40 overflows from the internal space 22 and reaches the top surface 20b and the filled transparent sealing resin 40 is closely adhered to the top surface 20b of the reflector 20. Thereby, the optical semiconductor device 1 in which the top surface 20b of the reflector 20 and the transparent sealing resin 40 are bonded to each other is obtained.

As such, according to the optical semiconductor device according to this embodiment, because the silver plating layer 16 is covered with the clay film 50, sulfuration of the silver plating layer 16 can be suppressed. Thereby, the illuminance decrease of the optical semiconductor device 1 due to a change of a color of the silver plating layer 16 to a black color can be further suppressed. Because the transparent sealing resin 40 and the reflector 20 are bonded to each other, the transparent sealing resin 40 can be suppressed from being removed from the optical semiconductor device 1.

In addition, covering of the clay film 50 for the silver plating layer 16 can be easily performed by allowing the clay film 50 to cover the inner circumferential surface 20a of the reflector 20. Because the clay film 50 has a function of amplifying the frequency band of the blue light, the clay film 50 is formed on the inner circumferential surface 20a of the reflector 20, so that reflection efficiency of the blue light generated from the blue LED 30 can be increased.

The preferred embodiment of one aspect of the present invention has been described. However, the present invention is not limited to the embodiment described above.

For example, in the embodiment, the reflector 20 is formed of only the resin. However, a light reflecting layer such as silver may be formed on the inner circumferential surface 20a of the reflector 20. In this case, the transparent sealing resin 40 can be bonded to the inner circumferential surface 20a or the top surface 20b of the reflector 20 not provided with the light reflecting layer.

In addition, in the embodiment, the base 12 and the reflector 20 are separated members. However, the base 12 and the reflector 20 may be integrally formed.

In addition, in the embodiment, the blue LED 30 that generates the blue light is adopted as the light emitting diode bonded to the optical semiconductor device 1. However, a light emitting diode that generates light other than the blue light may be adopted.

EXAMPLE

Next, an example of one aspect of the present invention will be described. However, the present invention is not limited to the following example.

In the example, a square silver plating layer of which one side is 2 mm is formed on a resin plate to be a light reflecting portion and circular transparent sealing portions of which a diameter is 1 mm are formed in five places over the silver plating layer and a resin. As a material of the resin plate, polyphthalamide (Amodel A4122 as a commercial product, manufactured by Solvay Advanced Polymers K.K.) is used. As a material of the transparent sealing portion, methyl silicone (KER-2600A/B as a commercial product, manufactured by Shin-Etsu Chemical Co., Ltd.) is used.

In a comparative example, a square silver plating layer of which one side is 2 mm is formed on a resin to be a light reflecting portion and circular transparent sealing portions of which a diameter is 1 mm are formed in five places on only the silver plating layer. As materials of the resin plate and the transparent sealing portion, the same materials as those in the example are used.

In addition, after adhesive tapes are attached in the example and the comparative example, the adhesive tapes are detached in the example and the comparative example. As a result, the transparent sealing portion according to the comparative example is removed, but the transparent sealing portion according to the example is not removed. From this, it is confirmed that the transparent sealing portion can be prevented from being removed, by bonding the transparent sealing portion and the light reflecting portion to each other, in an optical semiconductor device.

REFERENCE SIGNS LIST

1: optical semiconductor device
10: substrate
10a: surface of substrate
12: base
14: copper plating plate
16: silver plating layer
20: reflector (light reflecting portion)
20a: inner circumferential surface
20b: top surface
20c: outer circumferential surface
22: internal space
30: blue LED (blue light emitting diode)
32: die bond material
34: bonding wire
40: transparent sealing resin (transparent sealing portion)
42: fluorescent material
50: clay film
L: clay diluted solution
U: non-covering portion

The invention claimed is:

1. An optical semiconductor device comprising:
a substrate that has a silver plating layer formed on a surface;
a light emitting diode that is bonded to the silver plating layer;
a light reflecting portion that surrounds the light emitting diode;
a transparent sealing portion that is filled into the light reflecting portion and seals the light emitting diode; and
a clay film that coats the silver plating layer, wherein a thickness of the clay film is 0.05 μm to 1 μm, and
wherein the transparent sealing portion and the light reflecting portion are bonded to each other.

2. The optical semiconductor device according to claim 1,
wherein the light reflecting portion includes an inner circumferential surface that rises from the substrate to surround the light emitting diode and forms an internal space storing the light emitting diode,
the clay film coats a part of the inner circumferential surface, and
the transparent sealing portion is bonded to a non-coating portion of the inner circumferential surface not coated by the clay film.

3. The optical semiconductor device according to claim 2,
wherein the light emitting diode is a blue light emitting diode that generates blue light.

4. The optical semiconductor device according to claim 2,
wherein an area of the non-coating portion is equal to or more than 1% of an area of the inner circumferential surface.

5. The optical semiconductor device according to claim 2,
wherein an area of the non-coating portion is equal to or less than 99% of an area of the inner circumferential surface.

6. The optical semiconductor device according to claim 1,
wherein the light reflecting portion includes an inner circumferential surface that rises from the substrate to surround the light emitting diode and forms an internal space storing the light emitting diode and a top surface that is adjacent to the inner circumferential surface and is positioned outside the internal space,
the clay film coats the inner circumferential surface, and
the transparent sealing portion is bonded to the top surface.

* * * * *